United States Patent [19]

Nishino et al.

[11] Patent Number: 5,465,091
[45] Date of Patent: Nov. 7, 1995

[54] TOUCH SENSOR

[75] Inventors: Atsushi Nishino, Neyagawa; Akihiko Yoshida, Hirakata; Teruo Namba, Tokyo; Masaaki Aoki, Tokyo; Atsushi Naito, Tokyo, all of Japan

[73] Assignees: Showa Shell Sekiyu K.K.; Matsushita Electrical Industrial Co., Ltd.

[21] Appl. No.: 197,533

[22] Filed: Feb. 16, 1994

Related U.S. Application Data

[63] Continuation of Ser. No. 903,673, Jun. 24, 1992, abandoned.

[30] Foreign Application Priority Data

Jun. 28, 1991 [JP] Japan ................... 3-158089

[51] Int. Cl.⁶ ........................... H03K 17/975
[52] U.S. Cl. .............. 341/33; 200/600; 324/686
[58] Field of Search .............. 341/33; 200/600; 324/686

[56] References Cited

U.S. PATENT DOCUMENTS 2,782,308  2/1957  Rug ........................... 341/33
2,873,637  2/1959  Herold ...................... 341/33
4,233,522  11/1980  Grummer ................... 341/33
4,550,310  10/1985  Yamaguchi ................. 341/33

FOREIGN PATENT DOCUMENTS 1176212  8/1964  Germany ................. 341/33

Primary Examiner—Kenneth A. Wieder
Assistant Examiner—Jose M. Solis
Attorney, Agent, or Firm—Beveridge, DeGrandi, Weilacher & Young

[57] ABSTRACT

A touch sensor has an LC oscillator circuit 1, 2, 3, and 4, a rectification circuit 10 which rectifies outputs of the oscillator circuit 1, 2, 3, and 4, a voltage detection circuit 12, 13, 14, and 15 which detects the rectified voltage, and a sensor plate 8 connected to the input section of the rectification circuit, and detecting contact of a finger with the sensor plate 8 by enabling the voltage detection circuit 12, 13, 14, and 15 to detects a drop of equivalent impedance due to a finger touching the sensor plate 8 as a change of voltage.

13 Claims, 2 Drawing Sheets

TOUCH SENSOR

This application is a continuation of application Ser. No. 07/903,673, filed Jun. 24, 1992, now abandoned, which application is entirely incorporated herein by reference.

BACKGROUND OF THE INVENTION

1. Field of the Invention

The present invention relates to a touch sensor which detects contact of a finger, etc. with a plate.

2. Description of the Related Art

As to touch switches electrodes are installed on a glass surface with EL as back lighting, various systems are designed.

The first system is a method to detect the hum induced by the commercial power supply to a human body. It falls into two categories to simply amplify the voltage and use it as a signal source and the other is to identify frequency and use it as a signal source.

The second system is a method to use leak current of the commercial power supply.

The third system is a method to use a PLL oscillator circuit and detect a sudden change in frequency when a finger touches the electrode.

The fourth system is a method to connect two capacitors in series, apply a.c. signals from one side and detect the signals from the opposite side, install an electrode at a midpoint of two capacitors. The attenuation of signal is detected with a comparator by the impedance formation between the electrode and the ground when the electrode is touched with a finger. This system has been commercialized, for example, in IC MN1976 of Matsushita Electric Industrial Co., Ltd.

The fifth system is a method to detect current flowing between the two electrodes of a high resistor when the electrodes are connected by a touch of a finger. This system has already been applied in IC (SO56H) of Siemens company and IC (ML238/9) of Plessey company.

However, the five systems described above have several problems.

In the first system the high level of induced hum from EL could cause malfunction of the system and input impedance of the amplifier must be lowered to about 1 kΩ. The effect of the induced hum from EL is also susceptible to which of the time electrodes of EL is connected to the grounded electrode of the commercial power supply. This system can be adopted when EL is operated at a frequency higher than the commercial power frequency, but in the location in which there is not more than one power line in the vicinity of a human body, the input level may become insufficient.

The second system has restrictions in polarity of the commercial power supply and contains a danger of electric shock, and it cannot be said to suit the general purpose. In ICs of Plessey company, high resistors are inserted to one side of the double-pole electrode and the system is connected to 240 VAC, but this is not intended for popular application.

The third system shows small amount of frequency change due to high resistance of several thousands of KΩ of the electrode of the EL surface. The lock range must be narrowed, bringing up problems of stability and costs.

The fourth system can operate properly when the electrode is made with a metal plate with a lower resistivity. However in the case of a transparent electrode film installed on the glass surface the voltage drop caused by a finger touch is very small. A stable signal source greater than 30 V and a stable reference voltage are required, resulting in problems of costs and size.

The fifth system is the simplest of all, but the EL with the electrode installed on the glass surface is seriously affected with a problem of condensation of water vapor, and therefore it lacks reliability as a touch switch.

SUMMARY OF THE INVENTION

The present invention intends to provide a touch sensor which securely turns on and off, provides long-term reliability, and achieves small size, low costs, and high reliability.

The present invention relates to a touch sensor which has an LC oscillator circuit for carrying out LC oscillation, a demodulation circuit for demodulating the output of the LC oscillation circuit, a voltage detection circuit for detecting the voltage demodulated by the demodulation circuit, and a sensor plate connected to the above-mentioned demodulation circuit, and detects contact of a substance with the sensor plate by enabling the above-mentioned voltage detection circuit to detect a drop of equivalent impedance caused by the contact of the above substance with the above-mentioned sensor plate as a change of voltage.

According to the present invention, because the system utilizes a change of impedance, a touch sensor which has no restriction on locations to be applied provides stable operation and high reliability, and achieves small size and low costs. Only connecting the grounding enables the driving by d.c. power supply and hence the use in vehicles.

PREFERRED EMBODIMENTS OF THE PRESENT INVENTION

Figure 1:
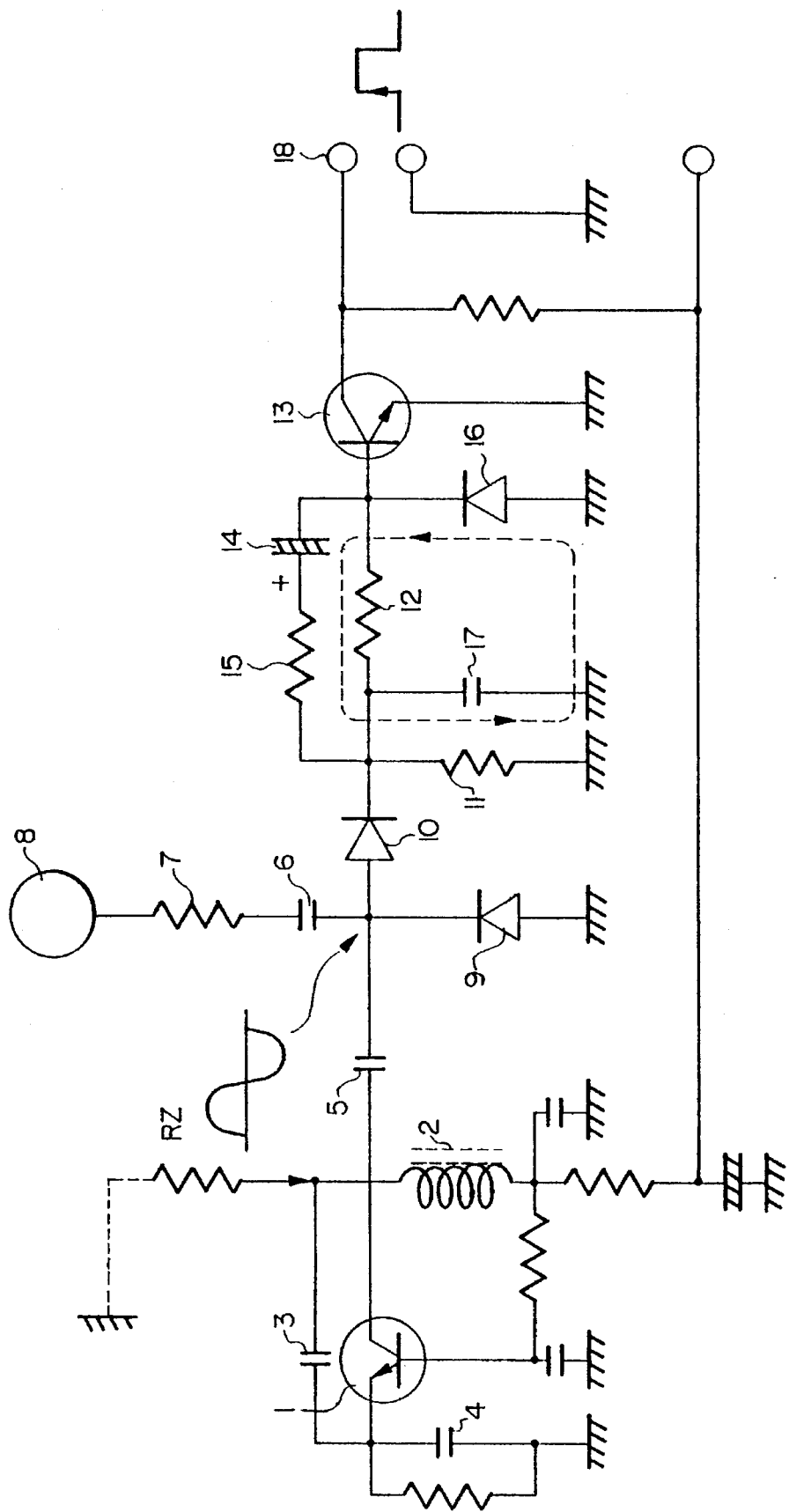
FIG. 1 is a circuit diagram showing one embodiment of the touch sensor of the present invention.

Referring now to the drawings, embodiments according to the present invention will be described in detail hereinafter.

FIG. 1 is a circuit of one embodiment of a touch sensor of the present invention. The circuit of this embodiment basically consists of an oscillator circuit, demodulation circuit, voltage detection circuit, and sensor plate. The oscillator circuit consisting of 1, 2, 3, and 4 has high resonance impedance and is designed to provide bias enough to turn on transistor 13 TR2. In this embodiment, the Colpitts oscillator circuit is adopted but any type of oscillator circuit can, in principle, be used. It is desirable that low-power stable sine waves are produced in such a manner to prevent interference to other equipment. The demodulation circuit can be of any system which is able to provide linear outputs without saturation, and the system using diodes would be preferable. The voltage detection circuit must produce logic-level outputs when the demodulated voltage lowers by several hundreds of mV. An operational amplifier can be used but in view of fluctuation and variation in the demodulated voltage, power supply, and temperature, mass-productivity is impaired because adjustment of VRF is required. In this case detection circuit using one transistor is preferable.

Now, the detail of the circuit of the present embodiment is described.

Transistor 1 composes a Colpitts oscillator circuit formed with the coil 2, capacitor 3, and capacitor 4. The amplitude of oscillation voltage essentially drops of voltage with lower Q at the time of resonance, when impedance Rz as shown with a broken line is applied. In the actual circuits, are connected the input section of the demodulator 10, the oscillator section via capacitor 5 and the sensor plate 8 via capacitor 6 and resistor 7 respectively. This is to protect the system with the circuit of diodes 9 and 10 from static electricity induced by a human body through the plate 8. The capacitor 6 is installed to cut the direct current, and if there is no resistor 7 and only capacitor 6 is installed, the capacitance component only is simply added to the resonance circuit when grounding condition of plate 8 is favorable, lowering only the frequency and not causing any voltage drop. By installing the resistor 7, capacitance component is eliminated. This method is applicable to a switch in which plate 8 is made into double poles. At both ends of resistor 11, d.c. voltage demodulated is produced. This voltage has to be the value to hold the collector of transistor 13 turned ON (L) via resistor 12, namely, be greater than VBE. Thus fluctuation of oscillation voltage due to environmental conditions and variation in circuits can be ignored. The capacitor 14 is generally charged to a specified voltage but when the impedance component is applied between the plate 8 and the grounding and the voltage across resistor 11 lowers, the capacitor 14 allows discharge current to flow in the broken line direction. That is, bias opposite to the base of the transistor 13 is formed, turning off (H) the collector of the transistor 13. The resistor 15 is a discharging time constant and the diode 16 serves as a discharge route. Numeral 18 is a pulse output terminal.

The performance of a touch sensor of the present invention is described.

(Behavior)

Because the working impedance cannot be measured in the floating condition, impedance was measured with pure C and R being inserted between the grounding and the plate, with the results of about 50 kΩ for R and about 25 pF for C when oscillation frequency was 360 kHz.

(Demodulated output)

When VDD is 5 V, the d.c. voltage across both ends of the resistor 11 is 2.5 V and when a finger touches the plate 8, 300–500 mV voltage drop occurs. When about one piece of newspaper is inserted between the finger and touch plate, enough signals of the logic level can be taken out from the collector of the transistor 13 although only about 80–100 mV voltage drop occurs.

[0024]

(Power consumption)

When VDD is 5 V, the oscillator consumes 152 μA. The oscillator oscillates satisfactorily at 1 V or lower but in actual use, the minimum voltage of 3 V is recommended taking VBE of the transistor 13 into consideration.

(Working temperature)

Fluctuation in oscillator output voltage and frequency are not, in principle affected with temperature change. The only effect due to a temperature change is caused by fluctuation of hfe of the transistor 13 only. The working temperature range is −30° to +70° C.

(Power supply for the circuit)

In principle, malfunction occurs when the voltage change occurs in the negative direction. However, the voltage drop occurring the moment a load is added as when a relay is turned ON, does not create any problem because the change is in the working direction. When the commercial power supply is not used for the power source, grounding must be provided with respect to the floor surface.

(Malfunction due to noise)

Because there is no amplifier circuit at the preceding stage of the transistor 13 and the impedance to the alternate current is comparatively low due to capacitors 17 and 14, the circuit will not malfunction due to noises from d.c. motors.

(Embodiment 2)

Figure 2:
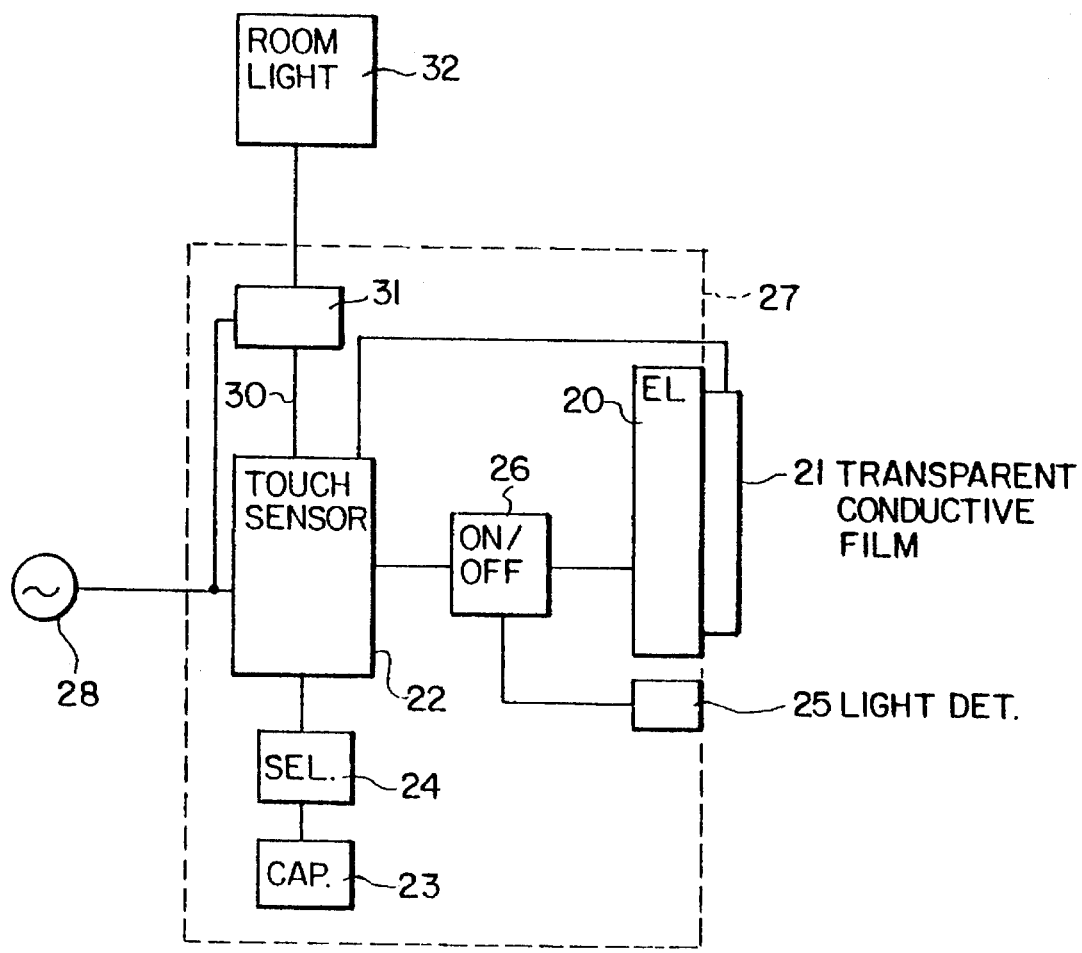
FIG. 2 is a block diagram of the circuit of an EL selector panel switch applied with the touch sensor of the present invention.

FIG. 2 shows an application example using the touch sensor of the present invention. The example consists of an EL element 20, a transparent conductive film 21 formed on the surface of the front glass of the EL element 20, electronic circuit for the touch sensor of the present invention 22, an electric double-layer capacitor 23, a light detection switch 25, an on/off switch 26, and an enclosure case 27. 26 is a commercial electric power source. For the electronic circuit of the touch sensor 22, the transparent conductive film 21 represents the above-mentioned plate 8 and numeral 30 corresponds to the output terminal 18. Consequently, touching the transparent conductive film 21 with a finger outputs pulses from the output terminal 30, turning on and off the room light 32.

On the other hand, the light detection switch 25 detects the day light during daytime and turns off the on/off switch 26. Consequently, the EL element 20 is not lighted. However, when night comes, the on/off switch 26 is turned on and the EL element 20 goes on. Consequently, the EL element 20 becomes bright through the portion of the transparent conductive film 21.

When power fails, the power supply is switched by selector switch 24 from the commercial power supply 28 to the electric double layer capacitor 23, keeping the EL element 20 lighted to serve as an emergency light.

The present invention is a system to utilize a change in impedance and therefore has no restriction to locations to be applied provides stable operation and high reliability, and achieves a small-size low-cost switch. Connecting to the grounding allows the switch to operate on the d.c. power supply and enables the application to vehicles. This will open up a wide variety of application.

What is claimed is:

1. A single-oscillator touch sensor comprising:

oscillator circuit means consisting of an LC oscillator circuit, rectification circuit means for rectifying output from said LC oscillator circuit, sensor plate means connected to said oscillator circuit and said rectification circuit means at a common point located between said oscillator circuit and said rectification circuit means, a resistance element and a capacitance element connecting said sensor plate means to said common point, voltage detection circuit means for detecting contact between a substance and said sensor plate means by detecting an impedance drop caused by contact of the substance with said sensor plate means as a change in voltage in said rectification circuit means.

2. The touch sensor according to claim 1, wherein said rectification circuit means includes an RC circuit, said RC circuit being dischargeable by an impedance drop caused by contact between a substance and said sensor plate means.

3. The touch sensor according to claim 2, wherein said voltage detection circuit means includes means to output a pulse signal in response to discharging of said RC circuit.

4. The touch sensor according to claim 3, wherein said voltage detection circuit means includes transistor means, connected to said rectification circuit means through a discharge circuit, for generating said pulse signal.

5. The touch sensor according to claim 3, wherein said voltage detection circuit means includes transistor means for generating said pulse signal.

6. The touch sensor according to claim 3, wherein said RC circuit has a resistance value of 50 Kohms and said oscillator circuit means is adapted to operate at 360 kHz.

7. The touch sensor according to claim 3, wherein said RC circuit has a capacitance value of 25 pF and said oscillator circuit means is adapted to operate at 360 kHz.

8. The touch sensor according to claim 1, wherein said sensor plate means includes an electroluminescent panel and a transparent substrate on said panel.

9. the touch sensor according to claim 8, wherein said oscillator circuit operates at a sufficiently low frequency to prevent mutual interference between said oscillator circuit and said electroluminescent panel.

10. The touch sensor according to claim 8, wherein said electroluminescent panel is illuminated in response to a signal from a light detection sensor.

11. The touch sensor according to claim 1, wherein said oscillator circuit is a Colpitts oscillator circuit.

12. The touch sensor according to claim 1, wherein said rectification circuit means includes diode means for shunting to ground static discharge induced by contact by a substance with said sensor plate means.

13. The touch sensor according to claim 1, wherein said resistance element has a value of up to 50 Kohms.

* * * * *